(12) United States Patent
Kondo

(10) Patent No.: US 11,538,934 B2
(45) Date of Patent: Dec. 27, 2022

(54) SEMICONDUCTOR DEVICE HAVING A GROUP OF TRENCHES IN AN ACTIVE REGION AND A MESA PORTION

(71) Applicants: SANKEN ELECTRIC CO., LTD., Niiza (JP); Allegro MicroSystems, LLC, Manchester, NH (US)

(72) Inventor: Taro Kondo, Niiza (JP)

(73) Assignees: SANKEN ELECTRIC CO., LTD., Niiza (JP); Allegro MicroSystems, LLC, Manchester, NH (US)

(*) Notice: Subject to any disclaimer, the term of this patent is extended or adjusted under 35 U.S.C. 154(b) by 173 days.

(21) Appl. No.: 17/146,511

(22) Filed: Jan. 12, 2021

(65) Prior Publication Data

US 2022/0223729 A1    Jul. 14, 2022

(51) Int. Cl.
*H01L 29/78* (2006.01)
*H01L 29/10* (2006.01)
*H01L 29/40* (2006.01)

(52) U.S. Cl.
CPC ...... *H01L 29/7811* (2013.01); *H01L 29/1095* (2013.01); *H01L 29/404* (2013.01); *H01L 29/407* (2013.01); *H01L 29/7813* (2013.01)

(58) Field of Classification Search
CPC .......... H01L 29/7811; H01L 29/1095; H01L 29/404; H01L 29/407; H01L 29/7813; H01L 29/0619; H01L 29/41766; H01L 29/0696
USPC ....................................................... 257/330
See application file for complete search history.

(56) References Cited

U.S. PATENT DOCUMENTS

| | | | |
|---|---|---|---|
| 9,385,188 B2* | 7/2016 | Hirabayashi | H01L 29/063 |
| 9,818,696 B1 | 11/2017 | Fukunaga et al. | |
| 9,825,027 B1 | 11/2017 | Fukunaga et al. | |
| 9,929,265 B1 | 3/2018 | Kondo et al. | |
| 11,038,049 B2* | 6/2021 | Gangi | H01L 29/404 |
| 11,081,545 B2* | 8/2021 | Ohnishi | H01L 29/7811 |
| 2007/0052014 A1* | 3/2007 | Takahashi | H01L 29/404 |
| | | | 257/330 |

(Continued)

FOREIGN PATENT DOCUMENTS

JP    2017-107895 A    6/2017
JP    2017-126635 A    7/2017

(Continued)

*Primary Examiner* — Mohammad M Hoque
(74) *Attorney, Agent, or Firm* — Metrolex IP Law Group, PLLC

(57) ABSTRACT

A semiconductor device is disclosed that includes a group of trenches positioned in active region inside a first semiconductor region. A first trench is positioned in an outer peripheral region on an outer side of an active region. A second trench is positioned on an outer side of the first trench positioned in the outer peripheral region on the outer side of the active region. A mesa portion is positioned between the first and the second trenches. An insulating layer is positioned inside the first and second trenches. A second field plate is positioned inside the insulating layer in the first trench. A third field plate positioned inside the second insulating layer in the second trench. The mesa portion includes the semiconductor region electrically coupled to the first main electrode on an outermost side. The first trench does not have the gate electrode at upper part of the first trench.

7 Claims, 10 Drawing Sheets

(56) References Cited

U.S. PATENT DOCUMENTS

| | | | | |
|---|---|---|---|---|
| 2010/0123187 A1* | 5/2010 | Burke | ................... | H01L 29/407 |
| | | | | 257/330 |
| 2010/0123188 A1* | 5/2010 | Venkatraman | .... | H01L 29/41766 |
| | | | | 257/330 |
| 2013/0334598 A1* | 12/2013 | Okumura | ............ | H01L 29/0653 |
| | | | | 438/270 |
| 2017/0012099 A1* | 1/2017 | Yedinak | ............ | H01L 21/02104 |
| 2018/0175189 A1 | 6/2018 | Fukunaga et al. | | |
| 2019/0252543 A1 | 8/2019 | Fukunaga et al. | | |
| 2020/0058778 A1 | 2/2020 | Fukunaga et al. | | |
| 2020/0212218 A1* | 7/2020 | Kim | ................... | H01L 29/1095 |
| 2022/0157976 A1* | 5/2022 | Konishi | ............ | H01L 29/66348 |

FOREIGN PATENT DOCUMENTS

| | | | |
|---|---|---|---|
| JP | 2017-126636 | A | 7/2017 |
| JP | 6624370 | B2 | 12/2019 |
| JP | 6627452 | B2 | 1/2020 |

* cited by examiner

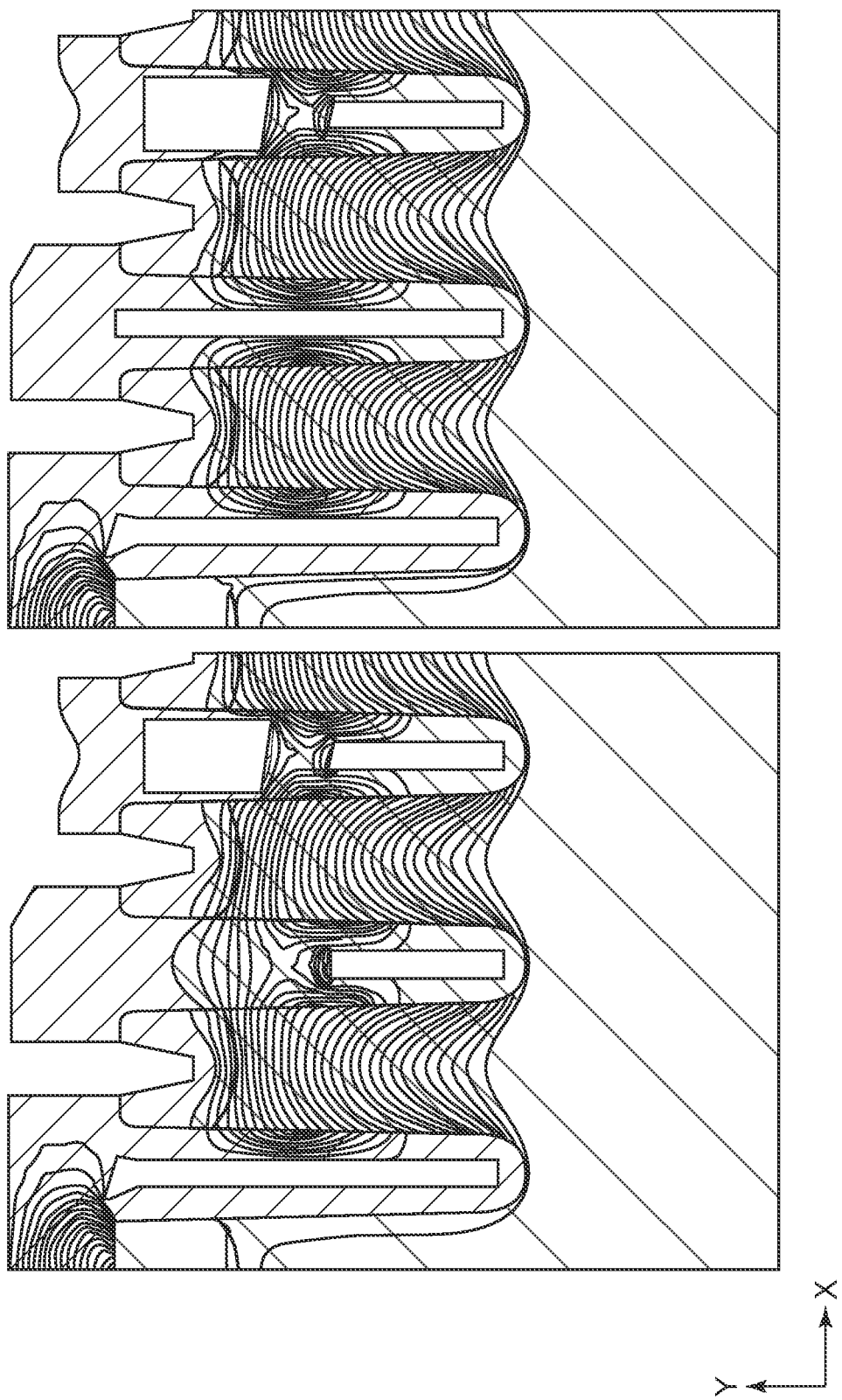

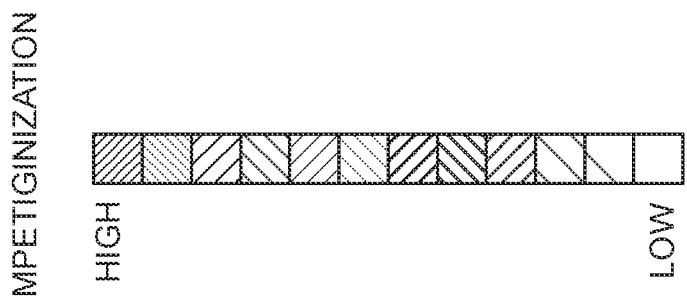
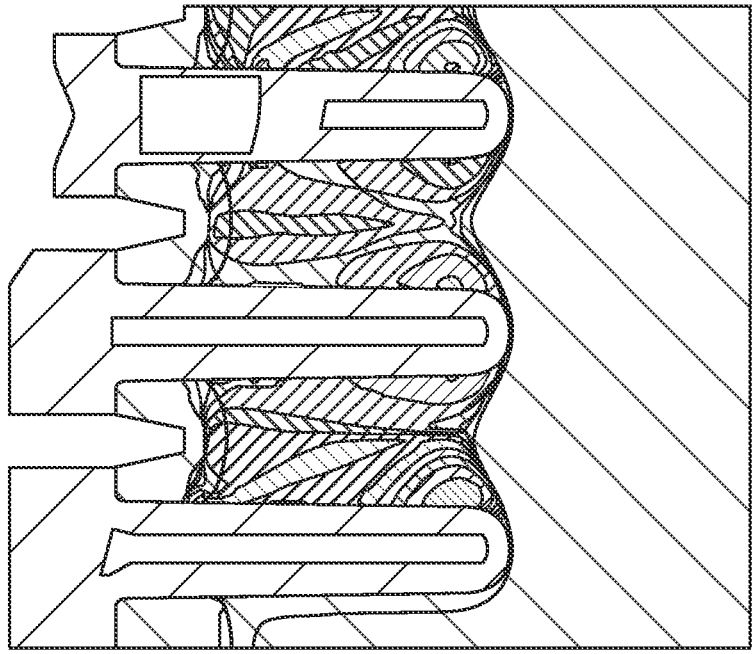
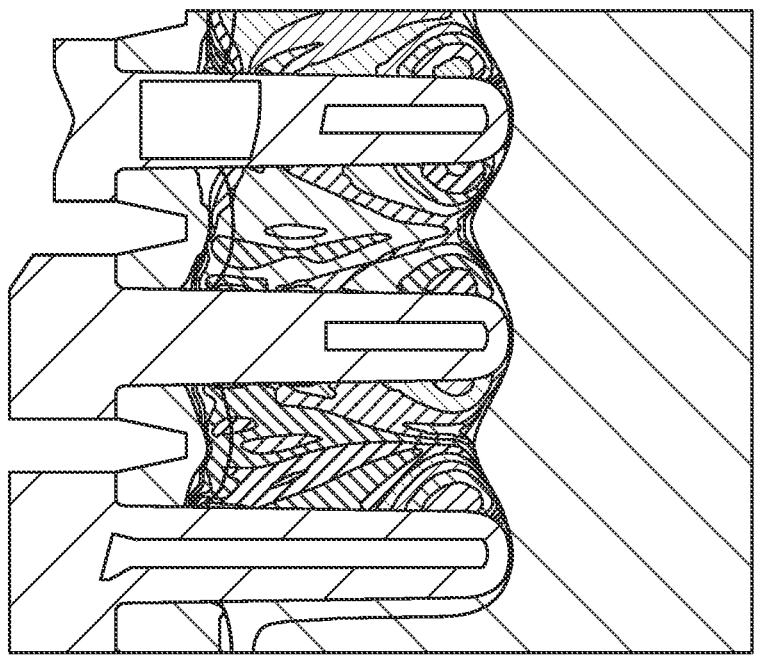
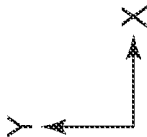

SEMICONDUCTOR DEVICE HAVING A GROUP OF TRENCHES IN AN ACTIVE REGION AND A MESA PORTION

BACKGROUND

The disclosure is related to a semiconductor device, more particularly, to a trench gate power semiconductor that performs large current switching operations.

A trench gate power MOSFET has been widely used as a power semiconductor device that performs large current switching operations. Japanese Patent No. 6624370 (hereinafter referred to as Patent Document 1) discloses a semiconductor device in which a field plate electrode is positioned below a gate electrode inside a gate trench of a MOSFET. According to this device, it is possible to increase an impurity concentration in a drift region so that on-resistance can be reduced. Moreover, provision of the field electrode below the gate electrode makes it possible to increase a gate input charge Qg. In the meantime, Patent Document 1 discloses a configuration in which a trench outer peripheral structure to arrange the field electrode inside the trench is provided in an outer peripheral region around the MOSFET.

As illustrated in FIG. 1 of Patent Document 1, the device disclosed in Patent Document 1 includes trenches 110 located in an outer peripheral region 300. A field plate electrode 130 is provided inside each of the trenches 110. An auxiliary electrode 50 and a gate electrode 60 are provided inside each trench 100 arranged in an active region 200.

In the device disclosed in Patent Document 1, a depletion layer located below the outermost region to be coupled to a source electrode 80, that is, below a region between the trench 110 in the outer peripheral region 300 and the trench 100 on the outermost side of the active region 200, may penetrate between the trench 100 and the trench 110. In this case, a distance between the gate electrode 60 inside the trench 100 on the outermost side of the active region 200 and the depletion layer is reduced whereby a sufficient withstand voltage may not be secured.

SUMMARY

A semiconductor device according to one or more embodiments includes: a first semiconductor region with first conductivity type; a second semiconductor region with second conductivity type positioned above the first semiconductor region; a third semiconductor region with the first conductivity type positioned above the second semiconductor region; a first main electrode electrically coupled to the first semiconductor region and the second semiconductor region; and a group of trenches positioned in an active region inside the first semiconductor region, each trench comprising an insulator positioned inside the trench, a gate electrode positioned at an upper part in the insulator, and a first field plate positioned at a lower part in the insulator; a first trench positioned in an outer peripheral region on an outer side of the active region; a second trench positioned on an outer side of the first trench positioned in the outer peripheral region on the outer side of the active region; a mesa portion positioned between the first and the second trenches; a first insulating layer positioned inside the first trench; a second insulating layer positioned inside the second trench; a second field plate positioned inside the first insulating layer in the first trench; and a third field plate positioned inside the second insulating layer in the second trench, wherein the mesa portion comprises the semiconductor region with the second conductivity type electrically coupled to the first main electrode on an outermost side, and the first trench does not have the gate electrode at upper part of the first trench.

BRIEF DESCRIPTION OF DRAWINGS

FIGS. 8A and 8B are diagrams illustrating electric potential distribution;

FIGS. 10A and 10B are diagrams illustrating breakdown points.

DETAILED DESCRIPTION

Figure 1:
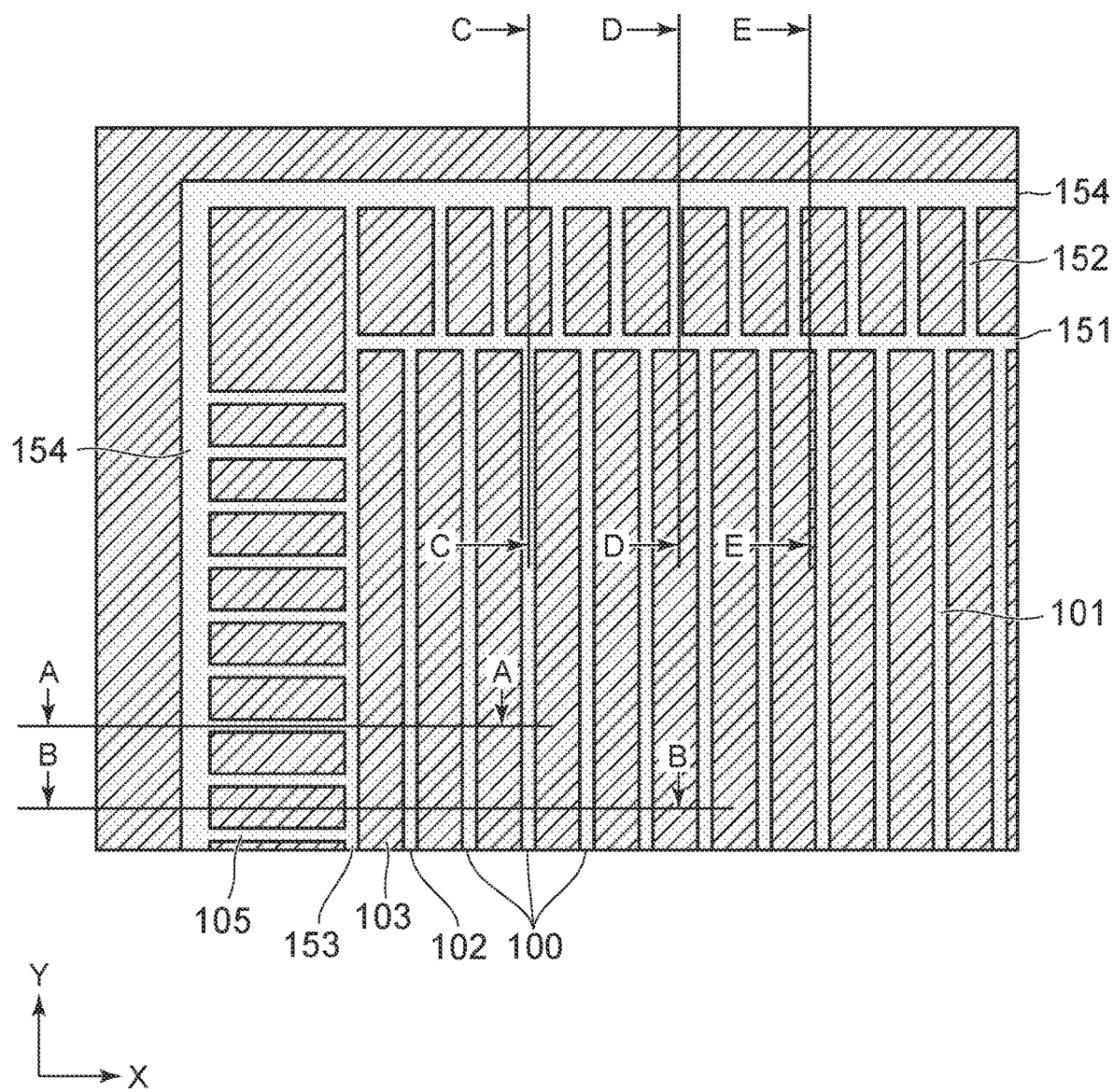
FIG. 1 is a diagram illustrating a top plan view of a part of a semiconductor device according to one or more embodiments.

One or more embodiments are described in detail with reference to the drawings. In the following description of the drawings, identical or similar portions may be denoted by identical or similar reference numerals. The description of the drawings is schematic. Relations of thicknesses and dimensions, ratios of thicknesses of layers, and the like are mere examples and do not intend to limit the technical ideas of the invention. In the meantime, dimensional relations or ratios may vary among the drawings. The following embodiments will describe an example in which a first conductivity type is an n-type and a second conductivity type is a p-type. However, there is also a case where it is possible to select a reverse relation of the conductivity types where the first conductivity type is the p-type and the second conductivity type is the n-type. When positional relations among components are discussed in the following description, explanations including an "upper side", a "lower side", a "right side", a "left side", and so forth are used as appropriate based on directions in the drawings to be referred to. Nonetheless, these directions do not limit the technical ideas of the invention. Meanwhile, the explanations including the "upper side", the "lower side", the "right side", the "left side", and so forth may be used even when relevant components are not in contact. On the other hand, an X axis and a Y axis may be illustrated when explaining the directions. Mainly in a case of a cross-sectional view, a "lateral direction" or a "longitudinal direction" may represent an X direction or an opposite direction to the X direction in the illustrated drawings. Meanwhile, a "height direction" may represent a Y direction in the illustrated drawing. In the meantime, a "depth direction" may represent an opposite direction to the Y direction in the illustrated drawing.

FIG. 1 is a diagram illustrating a plan view of a part of a semiconductor device according to one or more embodiments. In this semiconductor device, an outer peripheral trench 154 is provided in the vicinity of an outer peripheral portion of the semiconductor device in such a way as to surround an active region. Here, multiple first coupling trenches 105 that extend in a direction (an X direction) perpendicular to a longitudinal direction of trenches 101 in the active region are provided at intervals from one another so as to couple a trench 153 on an outer side for forming a mesa portion to the trench located on a further outer side. The trench 153 is provided on an outer peripheral side of a target mesa portion 103. The trench 153 forms the target mesa portion 103 and is coupled to the first coupling trenches 105. The outer peripheral trench 154 is coupled to the first coupling trenches 105. The first coupling trenches 105 are coupled to the trench 153. The outer peripheral trench 154, the first coupling trenches 105, and the trench 153 may be made of the same material and/or formed integrally with one another. The semiconductor device of the embodiment includes the active region which covers all or part of the trenches 101, and an outer peripheral region which covers the outer peripheral trench 154 that surrounds the active region. The active region is provided with a group of trenches that includes part or all of the trenches 101. A second coupling trench 151 is provided in order to couple trench ends that continue from the active region in the longitudinal direction (a Y direction) of the trenches 101 in the active region to one another. Multiple third coupling trenches 152 are provided at locations not being extension of the trenches 101 in planar view and at intervals from one another so as to couple the coupling trench 151 to the outer peripheral trench 154. Meanwhile, the ends of the coupling trench 151 are coupled to an end of the trench 153 so as to surround the active region on the whole.

Figure 2:
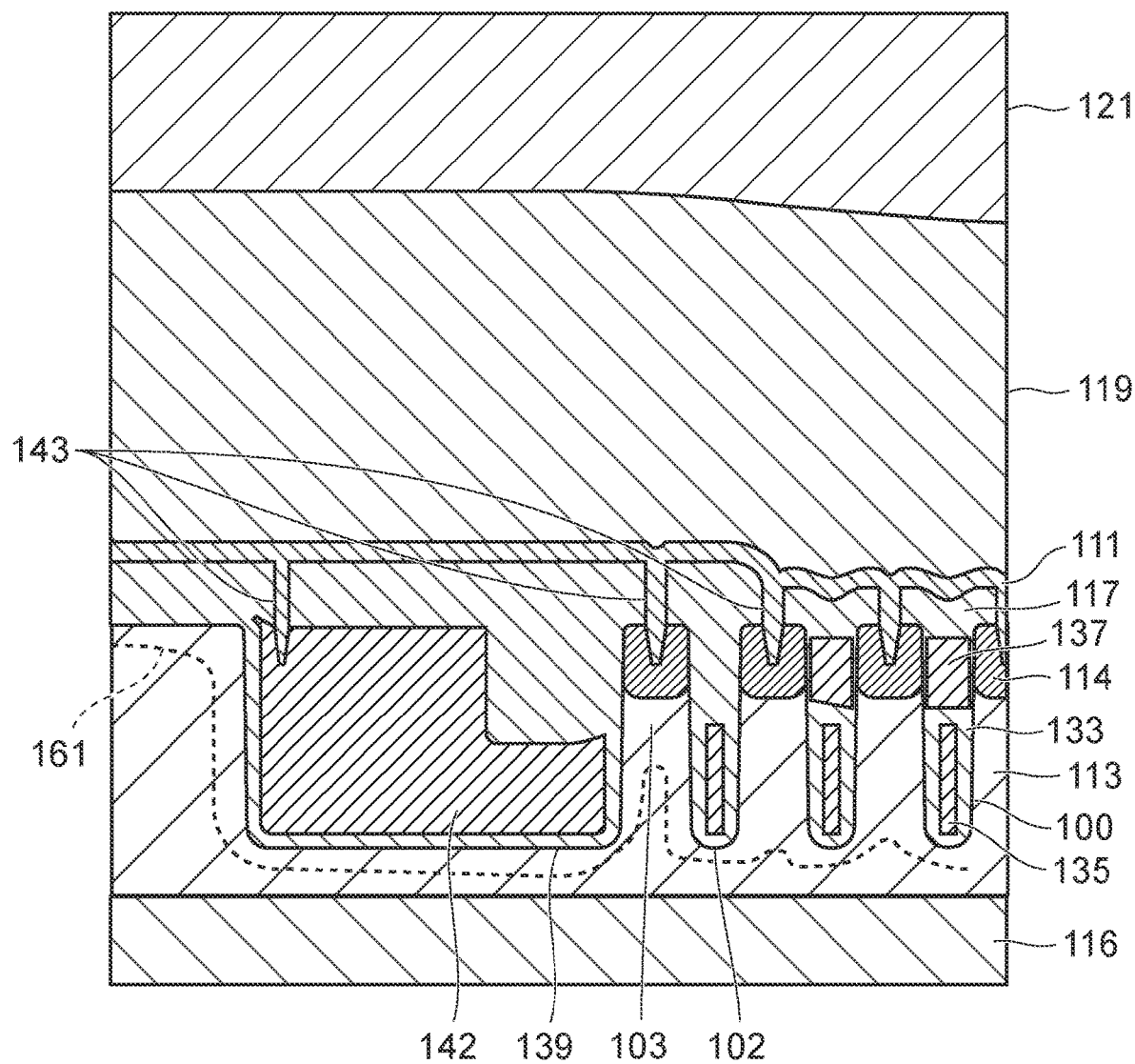
FIG. 2 is a diagram illustrating a cross-sectional view taken along the A-A line in FIG. 1.

FIG. 2 is a diagram illustrating a cross-sectional view taken along the A-A line in FIG. 1. In this semiconductor device, a drift region 113 is provided above a drain region 116. A trench 102, one or more trenches 100 arranged on an inner side of the trench 102 located in the outer peripheral region, and a base region 114 are provided in the drift region 113. The inside of these trenches 100 and 102, and of a trench 139 is filled with an insulating layer 133. A field plate 135 and a gate electrode 137 located away from the field plate 135 are arranged inside the insulating layer 133 that fills each trench 100. A field plate 136 is provided inside the insulating layer 133 that fills the trench 102, but the gate electrode 137 is not provided therein. The trench 139 includes the outer peripheral trench 154, the first coupling trenches 105, and the trench 153 on the outer side that forms the target mesa portion 103, which are illustrated in FIG. 1, and joins these trenches to one another. A field plate 141 is provided inside the insulating layer 133 that fills the trench 139. Regarding the field plate 142, field plates (141, 142, and 140) arranged inside the insulating layer 133 provided in the outer peripheral trench 154, the first coupling trenches 105, and the trench 153, respectively, are coupled to one another. Here, the drift region 113 may be made of first conductivity-type semiconductor and the base region 114 may be made of second conductivity-type semiconductor. Meanwhile, a source region 115 may be made of the first conductivity-type semiconductor and the drain region 116 may be made of the first conductivity-type semiconductor. Note that no source region 115 is provided between the trench 102 and the trench 139, between the trench 102 and the trench 100, or between the trenches 100 adjacent to each other.

Moreover, an interlayer insulating film 117 is provided above part of the drift region 113 not provided with the base region 114, the field plate 142 inside the trench 139, the field plate 136 inside the trench 102, the gate electrode 137, and the base region 114. A source electrode 111 is provided above the interlayer insulating film 117. Here, the source electrode 111 is electrically coupled to the source region 115, the base region 114, and the field plate 142 through contact holes 143 provided in the interlayer insulating film 117. A first protection film 119 is provided above the source electrode 111 and a second protection film 121 is provided above the first protection film 119.

Here, the inside of the trench (mesa trench) 102, which is located on the inner side to form the mesa portion 103 on the outermost side where the source electrode 111 is coupled to the base region 114, is provided only with the field plate 136. In other words, the insulating layer 133 is provided inside the rest of trenches 100 in the outer peripheral region, and the field plates 135 and the gate electrodes 137 are provided inside the insulating layer 133. On the other hand, no gate electrode 137 is provided inside the trench 102 on the inner side to form the mesa portion 103 on the outermost side where the source electrode 111 is coupled to the base region 114. As illustrated in FIG. 2, in the mesa portion 103 on the outermost side where the source electrode 111 is coupled to the semiconductor region of the second conductivity type such as the base region 114, a depletion layer 161 penetrates upward into the mesa portion as compared to a section of the mesa portion 103 on the inner side thereof. Here, the absence of the gate electrode 137 can secure a distance between the depletion layer 161 and the gate electrode. Thus, it is possible to suppress electric field concentration in the vicinity of the trench 102, thereby suppressing a deterioration of a withstand voltage.

Figure 3:
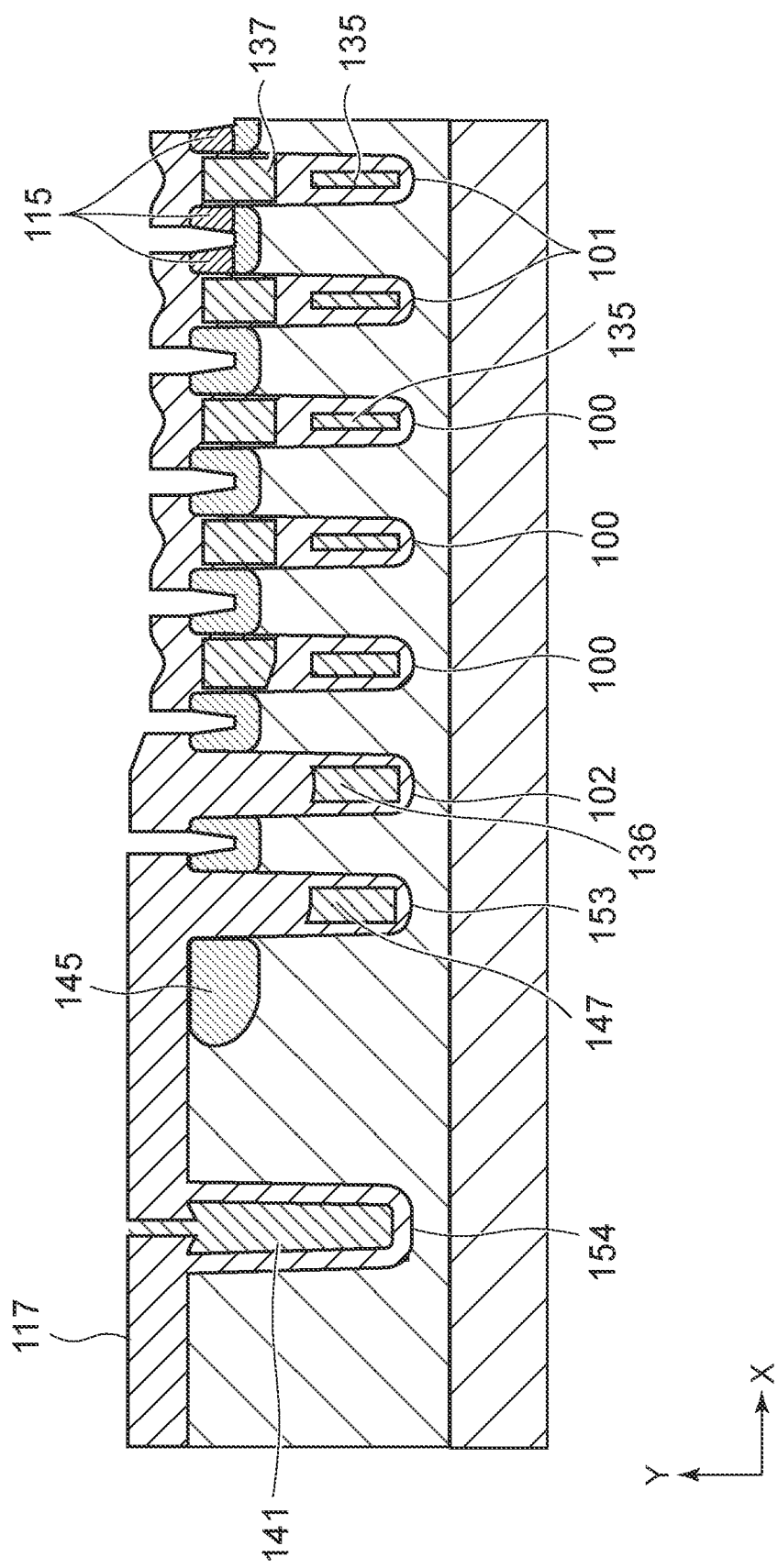
FIG. 3 is a diagram illustrating a cross-sectional view taken along the B-B line in FIG. 1.

FIG. 3 is a diagram illustrating a cross-sectional view taken along the B-B line in FIG. 1. The cross-sectional view in FIG. 3 omits the illustration of the source electrode 111, the first protection film 119, and so forth which are located on upper surfaces of the interlayer insulating film 117 and the like. In this semiconductor device, the trenches 100 in the outer peripheral region, the trenches 101 in the active region, the source regions 115, the outer peripheral trench 154, and the target mesa portion 103 sandwiched between the trench 102 and the trench 153 on the outer side are provided in the drift region 113. The source regions 115 in the active region are provided between the trenches 101 and are electrically coupled to the source electrode 111 and the base region 114 through holes or grooves in the interlayer insulating film 117 provided between the trenches 101. Here, a second conductivity-type semiconductor region 145 provided outside the trench 153 on the outer side is separated from the base region 114 and is set to floating potential.

Here, only the field plate 136 is provided inside the trench 102 and no gate electrode is provided therein. A height of an upper surface of the field plate 136 inside the trench 102 without the provision of the gate electrode is set substantially equal to a height of an upper surface of the field plate 135 inside each trench 101 in the active region. Meanwhile, a height of an upper surface of a field plate 147 inside the trench 153 on the outer side of the target mesa portion 103 is substantially equal to the height of the upper surface of the field plate 135 inside the trench 101 in the active region. In other words, the heights of the upper surfaces of the field plates 136 and 147 inside the trench 102 without the provision of the gate electrode and inside the trench 153 on the outer side are not set as high as the height of the upper surface of the gate electrode. Instead, upper parts of these trenches are buried with the insulating layer. In this way, densification of electric field distribution in the vicinity of a side wall of the trench 102 is relaxed and an electric field of a breakdown point located at a lower part of the trench 102 is relaxed as well. Thus, the withstand voltage of the semiconductor device can be increased.

In the meantime, the gate electrode 137 is not provided inside each first coupling trench 105. Moreover, the field plate 141 inside the outer peripheral trench 154 that extends in a longitudinal direction (the Y direction) of the trench 153 is coupled to the source electrode 111 through a contact hole provided in the interlayer insulating film 117. The field plate 147 inside the trench 153 on the outer side is prone to generate a displacement current. Here, the displacement current is passed from the field plate 147 through the field plate 142 inside the first coupling trench and is fed to the source electrode 111 through the field plate 141 inside the outer peripheral trench 154. Accordingly, a route of the flow of the displacement current to reach the source electrode 111 becomes shorter than that in a case of drawing up the field plate 135 only from the end in the longitudinal direction (the Y direction) of the trench 153. This makes it possible to reduce the displacement current in the semiconductor device.

Figure 4:
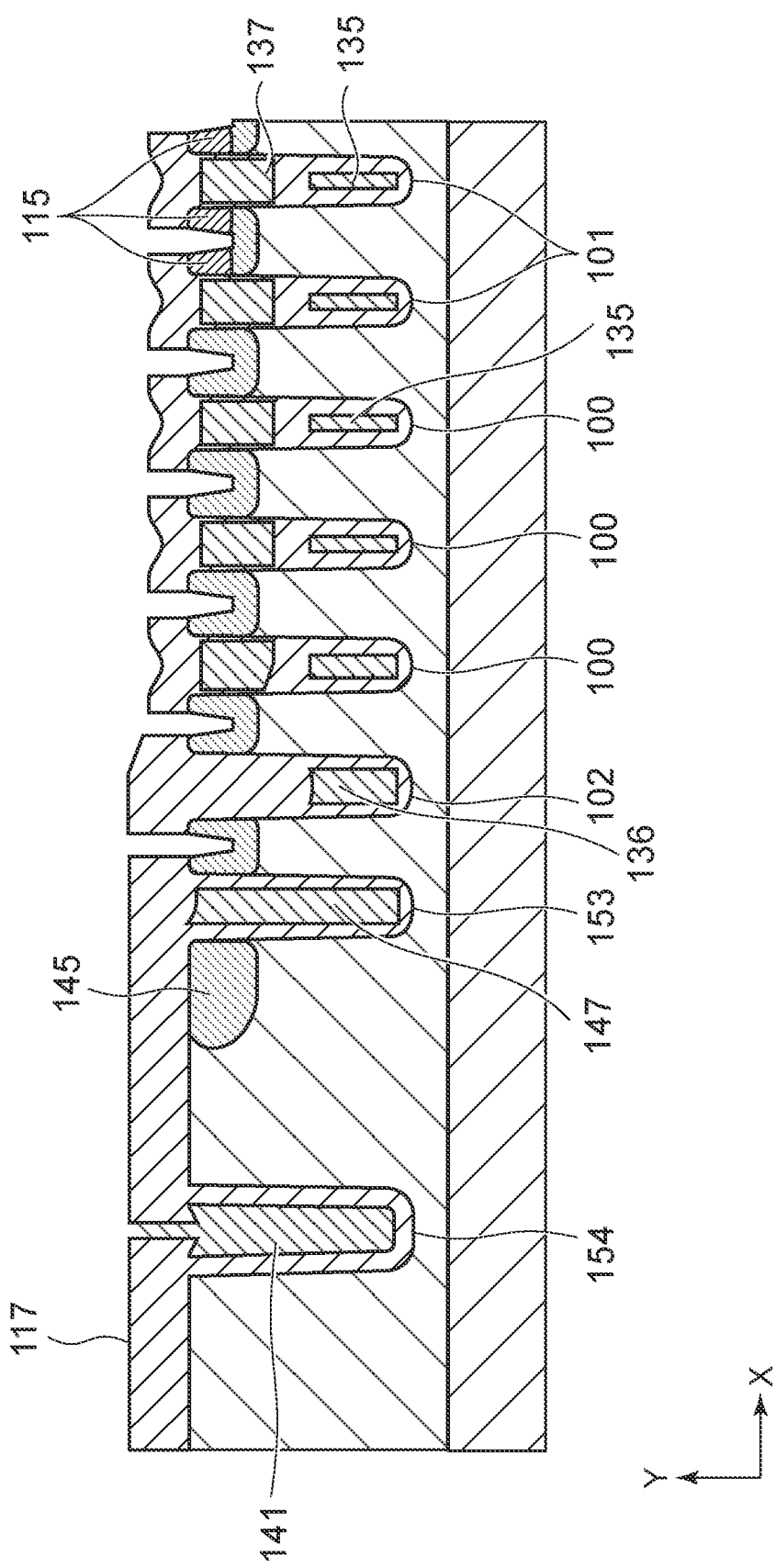
FIG. 4 is a diagram illustrating a cross-sectional view of an embodiment taken along the B-B line in FIG. 1.

FIG. 4 is a diagram illustrating a cross-sectional view of another embodiment taken along the B-B line in FIG. 1. The cross-sectional view in FIG. 4 omits the illustration of the source electrode 111 and the like located on the upper surfaces of the interlayer insulating film 117 and the like. In this semiconductor device, the trenches 100 in the outer peripheral region, the trenches 101 in the active region, the source regions 115, the outer peripheral trench 154, and the target mesa portion 103 sandwiched between the trench 102 and the trench 153 on the outer side are provided in the drift region 113. Only the field plate 136 is provided inside the trench 102 and no gate electrode is provided therein. Here, the height of the upper surface of the field plate 147 inside the trench 153 on the outer side of the target mesa portion 103 is higher than the height of the upper surface of the field plate 136 inside the trench 102, and may be substantially equal to a height of an upper surface of the gate electrode 137 inside the trench 101 in the active region. This configuration also relaxes the electric field at an upper part of the trench 102, relaxes the electric field at the breakdown point located at the lower part of the trench, and relaxes the electric field in the vicinity of a side wall of the outer peripheral trench 154 close to the trench 153 on the outer side. Thus, the withstand voltage can be increased.

Figure 5:
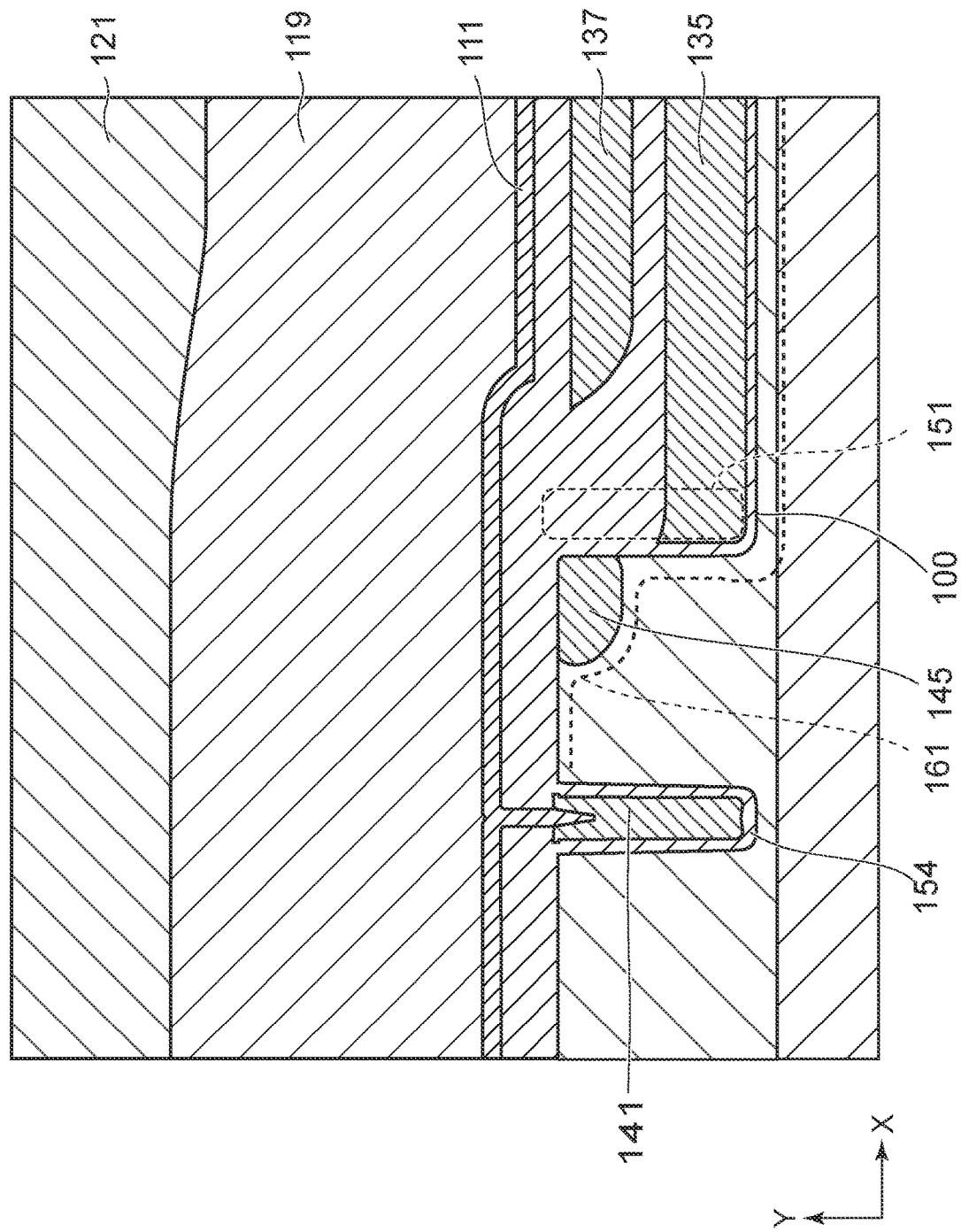
FIG. 5 is a diagram illustrating a cross-sectional view taken along the C-C line in FIG. 1.

FIG. 5 is a diagram illustrating a cross-sectional view of taken along the C-C line in FIG. 1. In this semiconductor device, the outer peripheral trench 154, the field plates 135 and 141, the trenches 100 each including the gate electrode 137, and the second conductivity-type semiconductor region 145 that extends from the ends of the trenches 100 to the outer peripheral side are provided in the drift region 113. Here, the second conductivity-type semiconductor region 145 is separated from the base region 114 and is set to the floating potential. Meanwhile, a region inside the trench 100 indicated with a dashed line corresponds to the second coupling trench 151. Here, the gate electrode 137 does not extend to the outer peripheral side, on in other words, toward the outer peripheral trench 154 as compared to the field plate 135. This makes it possible to secure a distance between the depletion layer 161 and the gate electrode 137. Alternatively, the semiconductor device of this embodiment need not be provided with the second conductivity-type semiconductor region 145. In the meantime, the cross-section of the trench 101 in the active region is also formed as the same as the cross-section of the outer peripheral trench 154.

Figure 6:
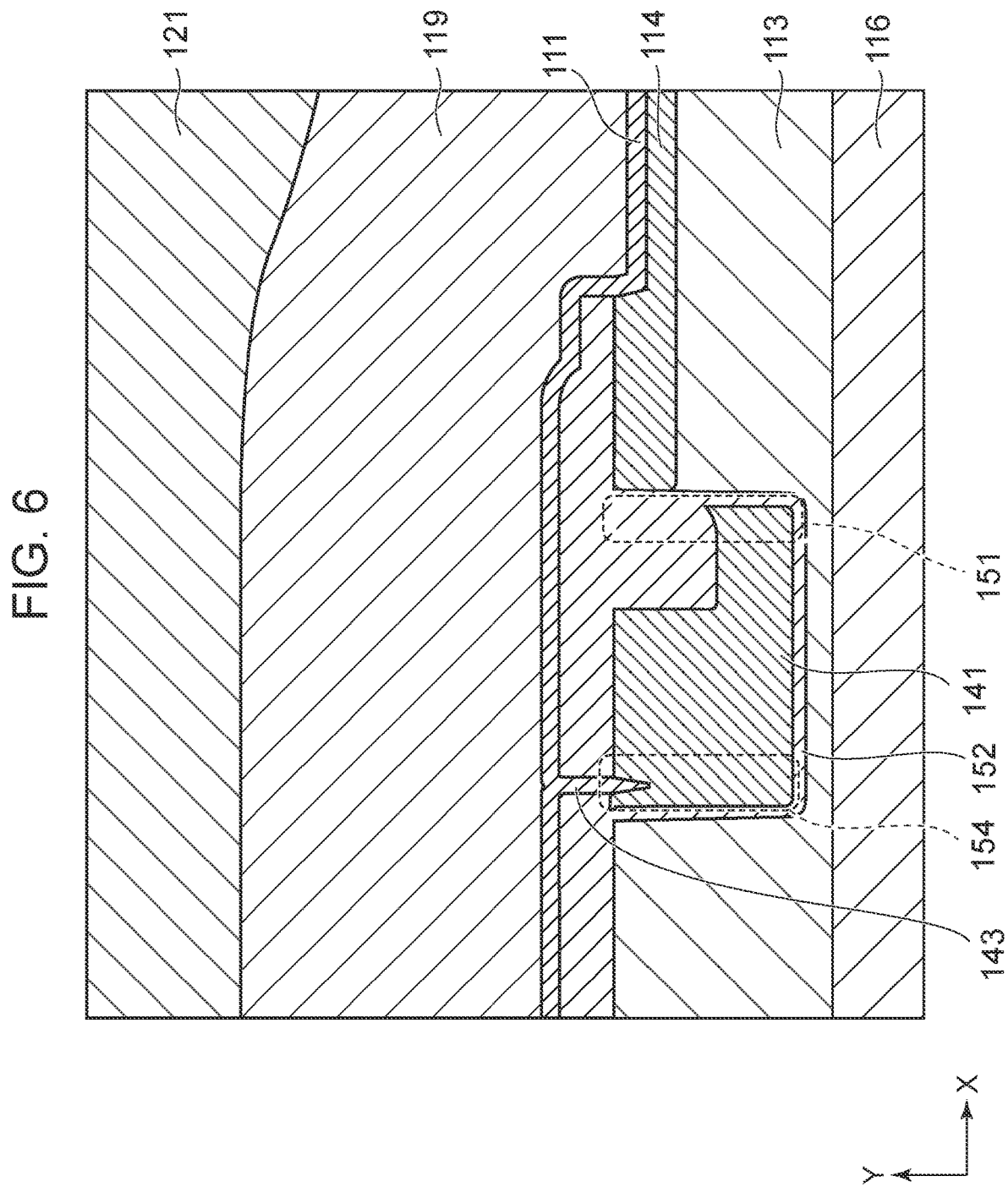
FIG. 6 is a diagram illustrating a cross-sectional view taken along the D-D line in FIG. 1.

FIG. 6 is a diagram illustrating a cross-sectional view taken along the D-D line in FIG. 1. In this semiconductor device, the trench 152 including the field plate 141, and the base region 114 are provided in the drift region 113. Dashed lines inside the trench 152 represent the outer peripheral trench 154 and the second coupling trench 151, each of which is coupled to the trench 152. Moreover, the field plate 141 is arranged inside the outer peripheral trench 154 and the second coupling trench 151 through the insulating layer. Meanwhile, the field plate inside the second coupling trench 151 is coupled to the field plate 147 inside the trench 153. Here, the base region 114 extends to a side surface of the trench 152. Moreover, a portion of the field plate 142 inside the trench 152 opposed to the base region 114 is scraped off so as to form an L-shaped cross-section. Here, the field plate inside the second coupling trench 151 surrounded by the dashed line may be set higher than the height of the upper surface of the field plate 136 inside the trench 102 as with the height of the upper surface of the field plate 147 inside the trench 153 on the outer side illustrated in FIG. 4, or may be set substantially equal to the height of the upper surface of the gate electrode 137 inside the trench 101 in the active region.

Figure 7:
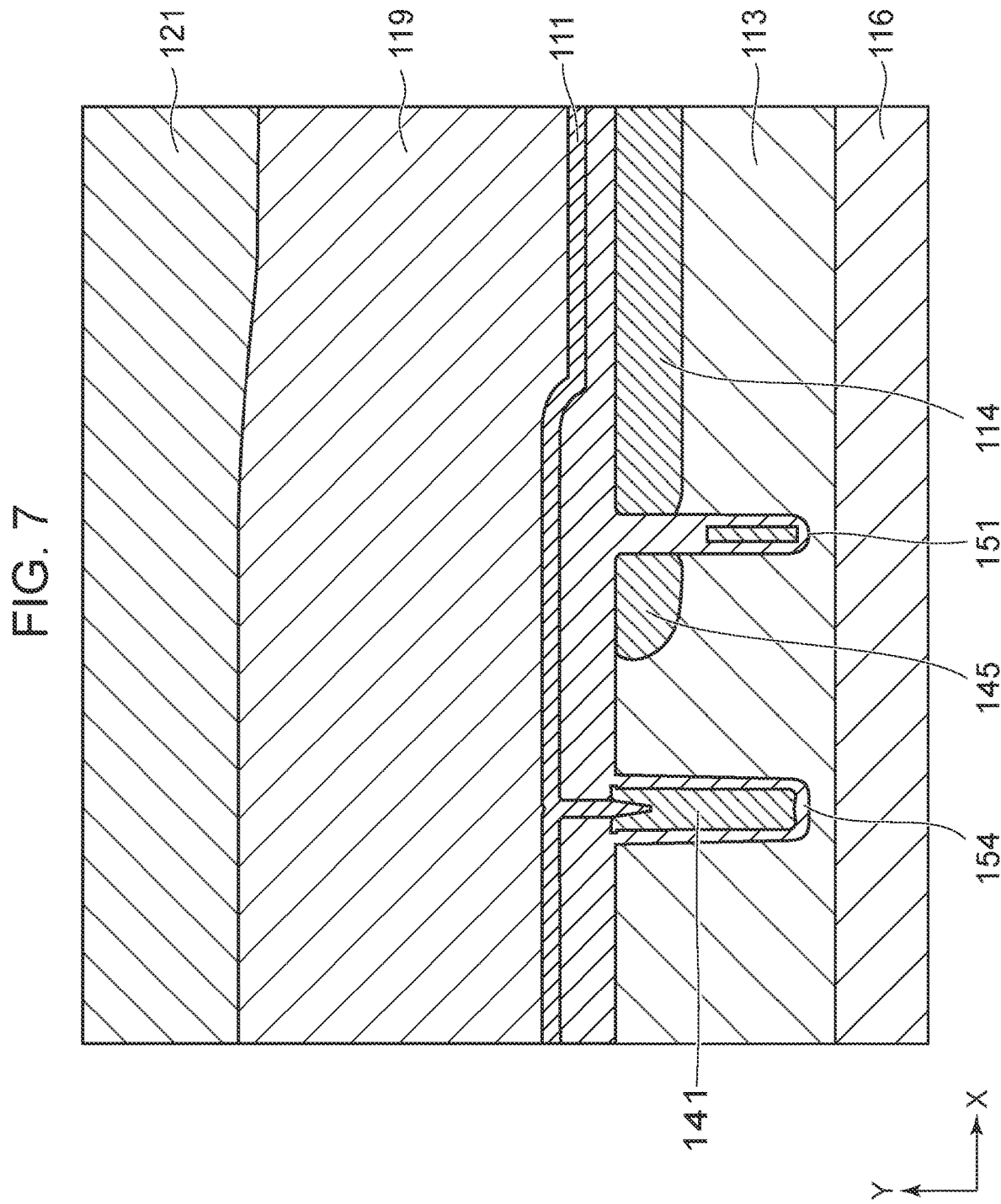
FIG. 7 is a diagram illustrating a cross-sectional view taken along the E-E line in FIG. 1.

FIG. 7 is a diagram illustrating a cross-sectional view taken along the E-E line in FIG. 1. In this semiconductor device, the outer peripheral trench 154, the second coupling trench 151, the second conductivity-type semiconductor region 145, and the base region 114 are provided in the drift region 113.

FIGS. 8A and 8B are diagrams illustrating electric potential distribution. FIG. 8A is a diagram that simulates electric potential distribution near the trenches 153, 155, and 100 illustrated in FIG. 4. The trench at the center of FIG. 8A corresponds to the trench 102 in FIG. 2. Specifically, the height of the upper surface of the field plate inside the trench at the center of FIG. 8A is almost equal to the height of the upper surface of the field plate inside the trench on the right side of FIG. 8A. Moreover, the gate electrode like the one inside the trench on the right side of FIG. 8A is not provided inside the trench at the center of FIG. 8A and this trench is buried with the insulating film instead. On the other hand, a height of an upper surface of a field plate inside a trench at the center of a comparative example of FIG. 8B is higher than a height of an upper surface of a field plate inside a trench on the right side of FIG. 8B, which is substantially equal to a height of a gate electrode therein. A concentration of potential lines in the vicinity of the insulating layer 133 at the side wall of the trench at the center in FIG. 8A is apparently sparser than a concentration of potential lines in the vicinity of the insulating layer 133 at the side wall of the trench at the center of FIG. 8B. In conclusion, according to the semiconductor device of the one or more embodiments, it is possible to increase the withstand voltage at the outer peripheral portion as well as the neighborhood thereof.

Figures 9A, 9B:
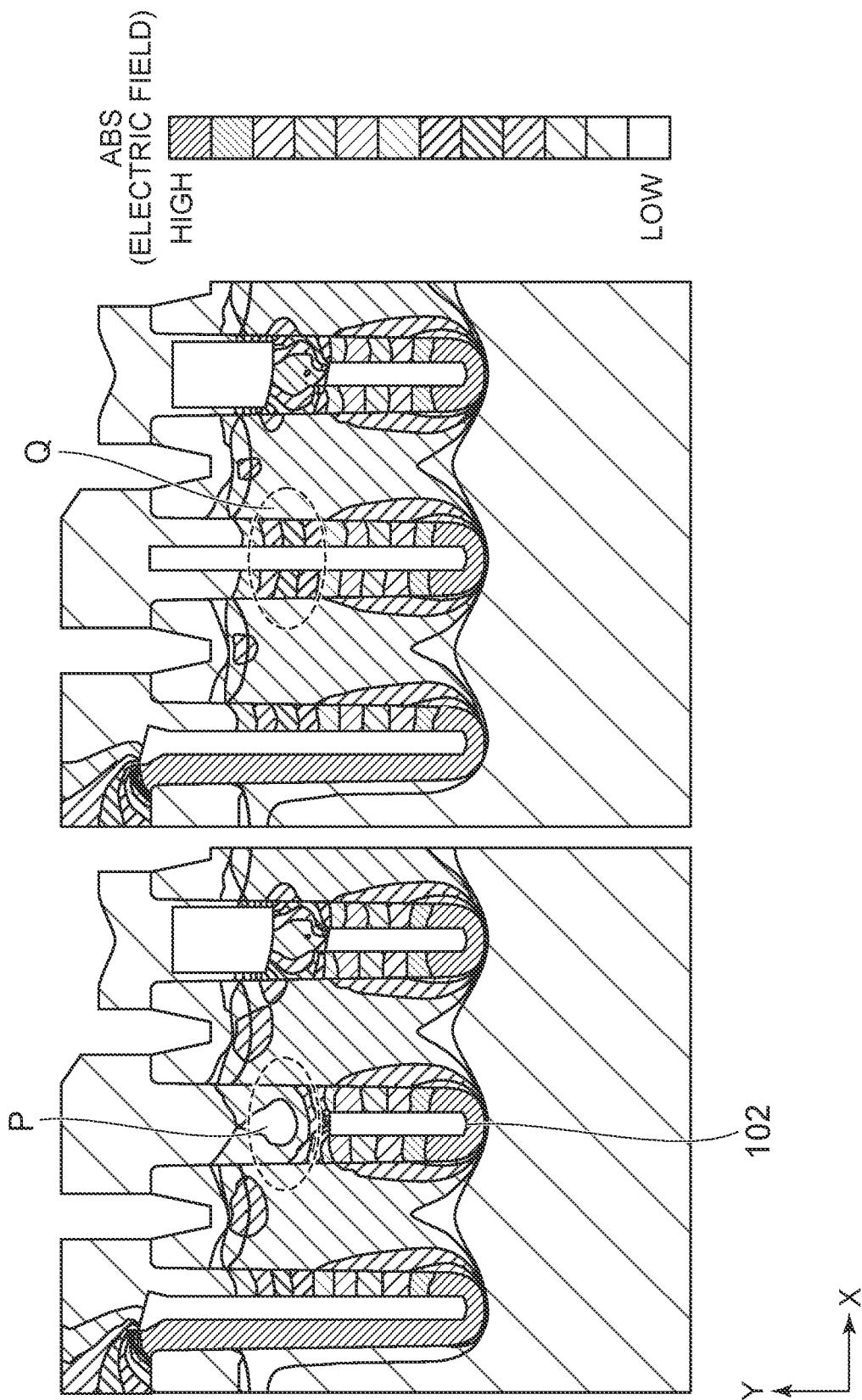
FIGS. 9A and 9B are diagrams illustrating electric field distribution.

FIGS. 9A and 9B are diagrams illustrating electric field distribution in the same structures as those illustrated in FIGS. 8A and 8B. An electric field strength in a region (in the vicinity of a region indicated with reference sign P in FIG. 9A) of the trench at the center of FIG. 9A not provided with the gate electrode or the field plate and buried with the insulating layer is apparently lower than an electric field intensity inside an insulating layer (in the vicinity of the insulating layer indicated with reference sign Q in FIG. 9B) at a side wall of the trench at the center of FIG. 9B.

FIGS. 10A and 10B are diagrams illustrating breakdown points in the same structures as those illustrated in FIGS. 8A and 8B. FIG. 10B illustrates the occurrence of a breakdown at a bottom of the trench on the left side and its impact has a large value. On the other hand, in FIG. 10A, a breakdown occurs at a bottom of the trench on the right side but its impact has a smaller value than the relevant value in FIG. 10B.

As described above, according to the one or more embodiments, it is possible to improve the withstand voltage by providing no electrode at the upper part inside the trench 102.

One or more embodiments described above may be applicable to semiconductor devices such as MOSFET (Metal Oxide Semiconductor Field Effect Transistor) and IGBT (Insulate Gate Bipolar Transistor).

Although preferred embodiments of this invention have been described above, it is to be understood that the discussions and drawings constituting part of this disclosure do not intend to limit the scope of this invention. It is obvious to a person skilled in the art to reach various alternative embodiments, examples, and operation technologies from the teaching of this disclosure. In this context, this invention will naturally encompass various other embodiments and so forth which are not expressly disclosed herein. Therefore, the technical scope of this invention is to be determined solely in consideration of the subject matters as defined in the appended claims that are deemed appropriate from the above description. This invention is applicable to a power semiconductor device in particular.

The invention claimed is:

1. A semiconductor device comprising:
    a first semiconductor region with first conductivity type;
    a second semiconductor region with second conductivity type positioned above the first semiconductor region;
    a third semiconductor region with the first conductivity type positioned above the second semiconductor region;
    a main electrode electrically coupled to the first semiconductor region and the second semiconductor region; and
    a group of trenches positioned in an active region inside the first semiconductor region, each trench comprising an insulator positioned inside the trench,
        a gate electrode positioned at an upper part in the insulator, and
        a first field plate positioned at a lower part in the insulator;
    a first trench positioned in an outer peripheral region on an outer side of the active region;
    a second trench positioned on an outer side of the first trench positioned in the outer peripheral region on the outer side of the active region;
    a mesa portion positioned between the first and the second trenches;
    a first insulating layer positioned inside the first trench;
    a second insulating layer positioned inside the second trench;
    a second field plate positioned inside the first insulating layer in the first trench; and
    a third field plate positioned inside the second insulating layer in the second trench, wherein
    the mesa portion comprises another second semiconductor region with the second conductivity type electrically coupled to the main electrode on an outermost side, and
    the first trench does not have the gate electrode at upper part of the first trench.

2. The semiconductor device according to claim 1, wherein the upper part in the first trench is buried with the first insulating layer.

3. The semiconductor device according to claim 2, wherein a height of an upper surface of the third field plate is higher than a height of an upper surface of the second field plate.

4. The semiconductor device according to claim 1, wherein the third field plate is coupled to the main electrode at a plurality of positions in a longitudinal direction of the third field plate.

5. The semiconductor device according to claim 2, wherein the third field plate is coupled to the main electrode at a plurality of positions in a longitudinal direction of the third field plate.

6. The semiconductor device according to claim 3, wherein the third field plate is coupled to the main electrode at a plurality of positions in a longitudinal direction of the third field plate.

7. The semiconductor device according to claim 6, further comprising:
    an outer peripheral trench positioned on an outer side of the second trench;
    a third insulating layer positioned inside the outer peripheral trench;
    a fourth field plate positioned inside the third insulating layer;
    a plurality of first coupling trenches coupled to the outer peripheral trench and the second trench at positions in a longitudinal direction of the third and second trenches; and
    a fifth field plate positioned in each first coupling trench through a fourth insulating layer and configured to couple the third field plate to the fourth field plate, wherein
    the fourth field plate is coupled to the main electrode.

* * * * *